(12) United States Patent
Huang et al.

(10) Patent No.: US 11,978,713 B2
(45) Date of Patent: May 7, 2024

(54) FLIP CHIP BUMP WITH MULTI-PI OPENING

(71) Applicant: Western Digital Technologies, Inc., San Jose, CA (US)

(72) Inventors: Shenghua Huang, Shanghai (CN); Yangming Liu, Shanghai (CN); Bo Yang, Dublin, CA (US); Ning Ye, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 252 days.

(21) Appl. No.: 17/750,047

(22) Filed: May 20, 2022

(65) Prior Publication Data

US 2023/0378112 A1    Nov. 23, 2023

(51) Int. Cl.
*H01L 23/00* (2006.01)

(52) U.S. Cl.
CPC .... *H01L 24/13* (2013.01); *H01L 2224/13147* (2013.01); *H01L 2224/16225* (2013.01); *H01L 2924/01029* (2013.01)

(58) Field of Classification Search
CPC ........... H01L 24/13; H01L 2224/13147; H01L 2224/16225; H01L 2924/01029; H01L 2224/0401; H01L 24/05
See application file for complete search history.

(56) References Cited

U.S. PATENT DOCUMENTS 9,129,818 B2 *  9/2015  Kuo .................. H01L 24/06
2021/0375896 A1 * 12/2021  Kim ................. H01L 23/3157

* cited by examiner

*Primary Examiner* — Karen Kusumakar
*Assistant Examiner* — Shawn Shaw Muslim
(74) *Attorney, Agent, or Firm* — PATTERSON + SHERIDAN, LLP

(57) ABSTRACT

The present disclosure generally relates to a flip chip assembly having a bump that reduces stress levels in a low-k dielectric layer in the flip chip. Rather than having a single, large area plateau that interfaces with a large corresponding opening of an insulating layer in the flip chip, the bump includes a plurality of much smaller pillars that interface with a corresponding plurality of openings in the insulating layer. In so doing, the low-k layer within the flip chip experiences much less stress and hence, fewer failures.

17 Claims, 5 Drawing Sheets

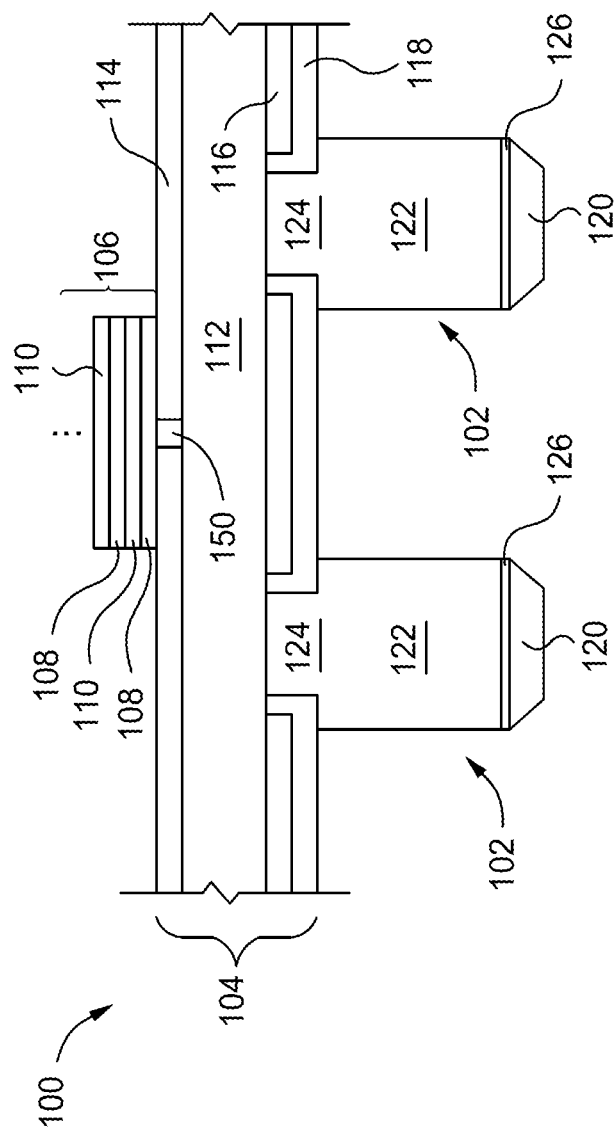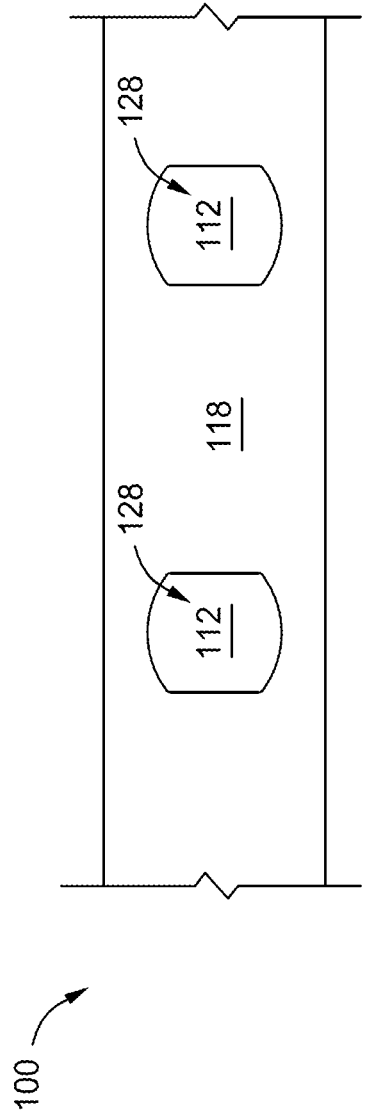
FIG. 1A
FIG. 1B

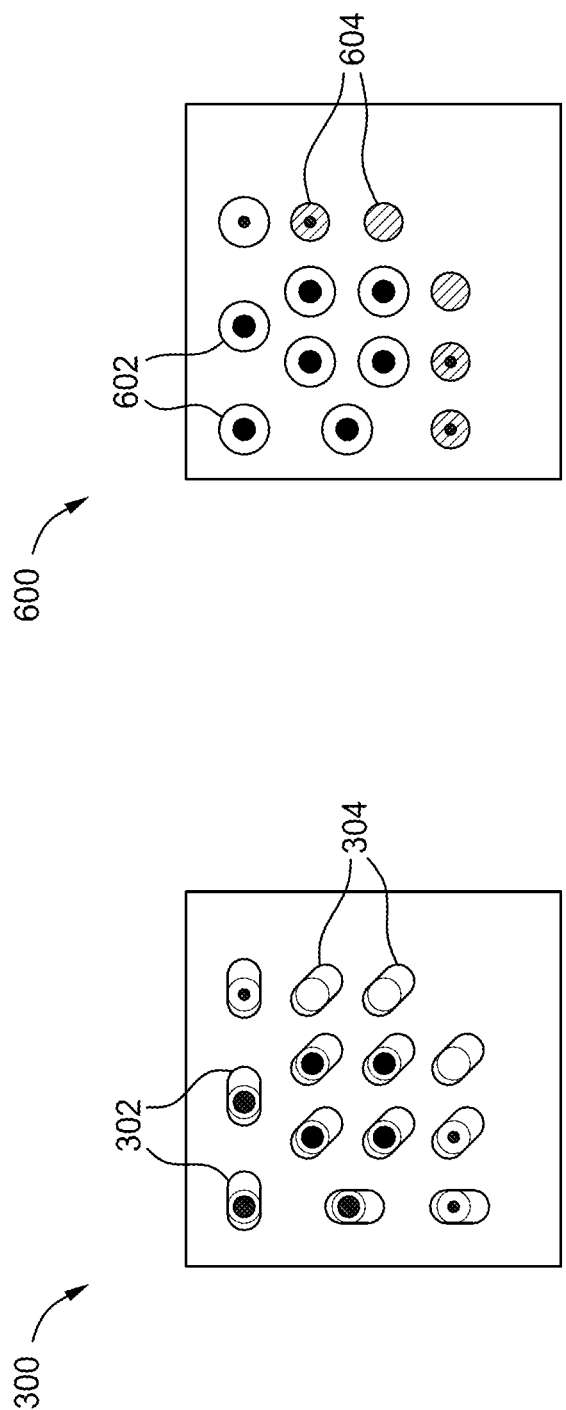

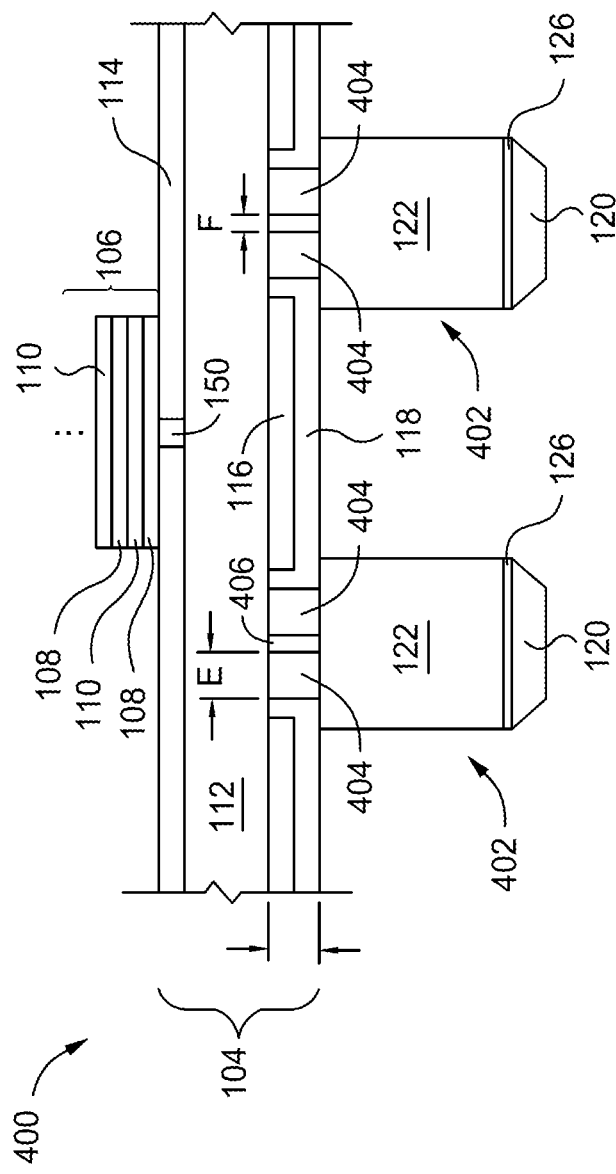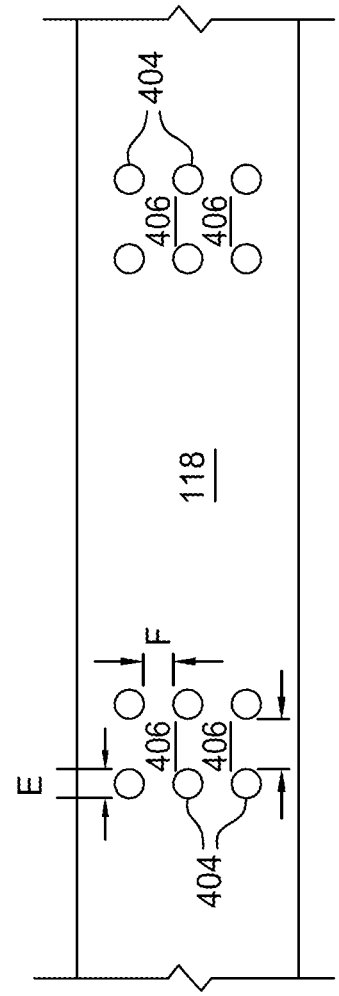
FIG. 4A
FIG. 4B

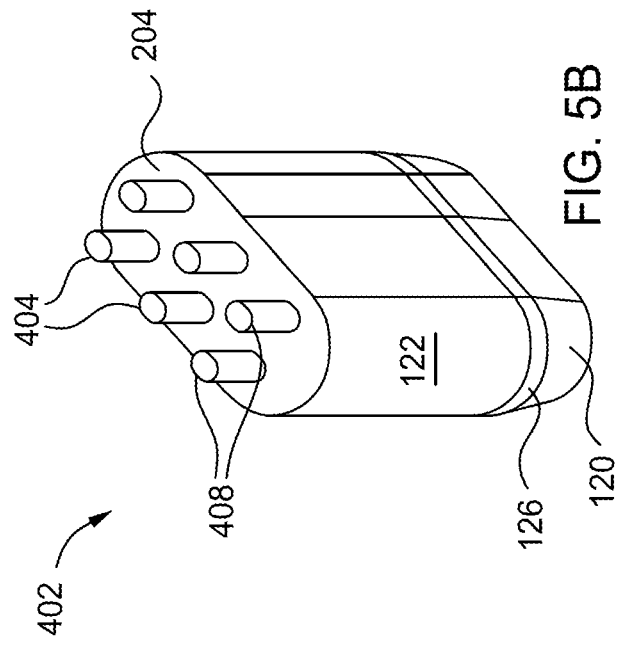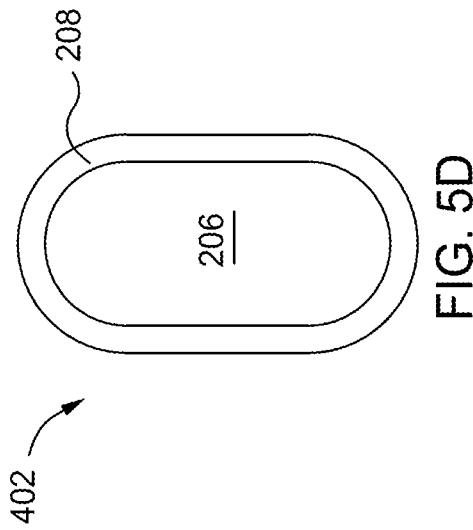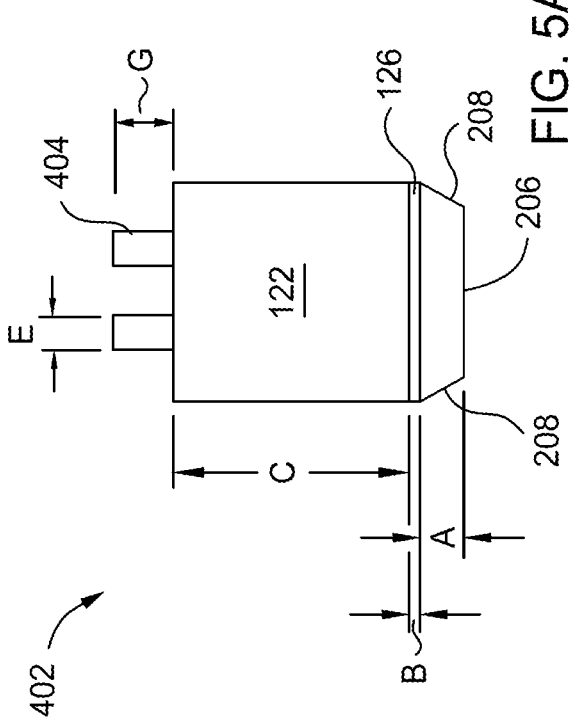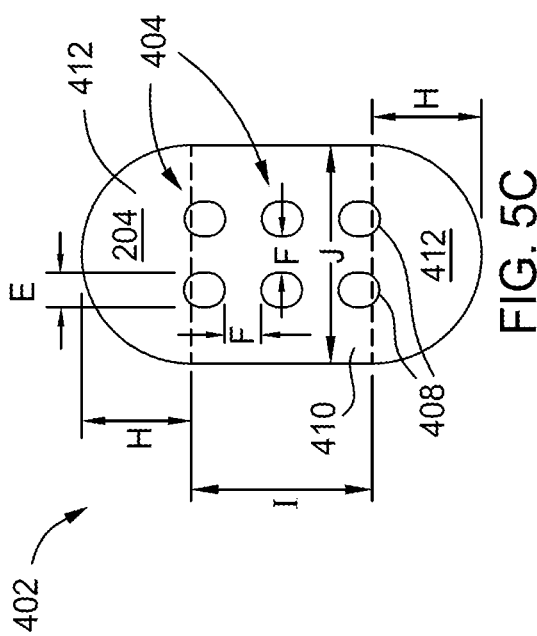

FLIP CHIP BUMP WITH MULTI-PI OPENING

BACKGROUND OF THE DISCLOSURE

Field of the Disclosure

Embodiments of the present disclosure generally relate to a flip chip and a bump that reduces stress levels in a low-k dielectric layer in the flip chip.

Description of the Related Art

Flip chips typically include multiple layers and interconnects therebetween. Amongst the multiple layers, electrically insulating or dielectric material electrically isolates the interconnects and conductive traces to ensure the flip chip does not short out.

One particular type of dielectric material that has gained traction in recent years is low-k dielectric material. Low-k dielectric material has a small dielectric constant (i.e., "k") compared to silicon dioxide. Low-k dielectric material is beneficial in semiconductor manufacturing because low-k dielectric material allows continued scaling of semiconductor devices. With shrinking electric devices, the insulating dielectric material has naturally grown closer together to the point where charge buildup and crosstalk can adversely impact semiconductor device performance. Low-k material alleviates those issues. Low-k materials can, however, be quite fragile and susceptible to cracking. When a low-k material cracks within a semiconductor device, the situation may be referred to as an extreme low-k (ELK) crack.

Flip chip assemblies that include a bump portion are more susceptible to ELK cracks due to the stress induced by the connection between the bump portion and the flip chip. Therefore, there is a need in the art for bumps and flip chip assemblies that induce less stress and hence, reduce ELK cracks from forming.

SUMMARY OF THE DISCLOSURE

The present disclosure generally relates to a flip chip assembly comprising a bump that reduces stress levels in a low-k dielectric layer in the flip chip. Rather than having a single, large area plateau that interfaces with a large corresponding opening of an insulating layer in the flip chip, a plurality of much smaller pillars interface with a corresponding plurality of openings in the insulating layer. In so doing, the low-k layer within the flip chip experiences much less stress and hence, fewer failures.

In one embodiment, a bump for a flip chip comprises: a bump body having a first electrically conductive portion, a second electrically conductive portion coupled to the first electrically conductive portion; and a solder portion coupled to the second electrically conductive portion, wherein the first electrically conductive portion comprises at least two pillars extending therefrom in a direction away from the second electrically conductive portion.

In another embodiment, a flip chip assembly comprises: a flip chip body, wherein the flip chip body comprises: an electrically conductive pad; and a first electrically insulating layer disposed on the electrically conductive pad, wherein the first electrically insulating layer has a plurality of openings therethrough exposing the electrically conductive pad; and a bump coupled to the flip chip body, wherein the bump comprises: a bump body having a plurality of electrically conductive pillars, wherein each electrically conductive pillar is disposed in a corresponding opening of the first electrically insulating layer.

In another embodiment, a flip chip assembly comprises: a flip chip body; and at least one bump coupled to the flip chip body, wherein the bump comprises at least two means to couple the at least one bump to the flip chip body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a schematic cross-sectional illustration of a flip chip assembly with two bumps according to one embodiment.

FIG. 1B is a schematic bottom illustration of the flip chip assembly of FIG. 1A with the two bumps removed.

FIG. 3 is a graph illustrating stress levels in a flip chip assembly according to one embodiment.

FIG. 4A is a schematic cross-sectional illustration of a flip chip assembly with two bumps according to another embodiment.

FIG. 4B is a schematic bottom illustration of the flip chip assembly of FIG. 4A with the two bumps removed.

FIGS. 5A-5D are schematic illustrations of a bump according to another embodiment.

FIG. 6 is a graph illustrating stress levels in a flip chip assembly according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2A:
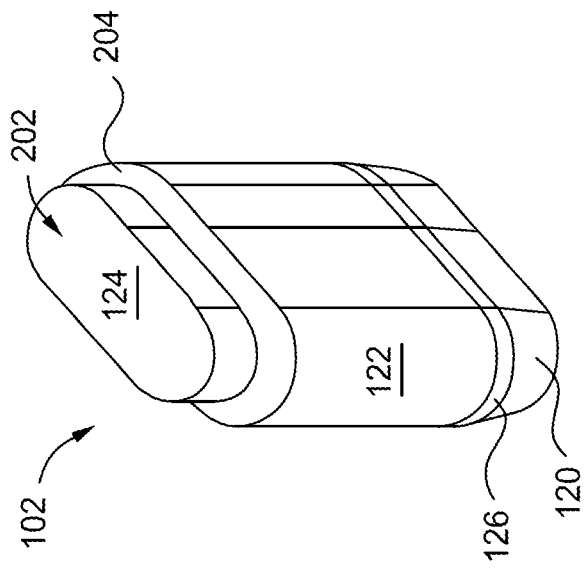
FIGS. 2A-2D are schematic illustrations of a bump according to one embodiment.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a flip chip assembly comprising a bump that reduces stress levels in a low-k dielectric layer in the flip chip. Rather than having a single, large area plateau that interfaces with a large corresponding opening of an insulating layer in the flip chip, a plurality of much smaller pillars interface with a corresponding plurality of openings in the insulating layer. In so doing, the low-k layer within the flip chip experiences much less stress and hence, fewer failures.

FIG. 1A is a schematic cross-sectional illustration of a flip chip assembly 100 with two bumps 102 according to one embodiment. FIG. 1B is a schematic bottom illustration of the flip chip assembly 100 of FIG. 1A with the two bumps 102 removed. The flip chip assembly 100 includes a flip chip portion 104, a bump portion that includes one or more bumps 102, and a semiconductor portion 106.

The semiconductor portion 106 includes numerous interconnect or electrical layers 108 and low-k dielectric layers 110. The flip chip portion 104 includes an interconnection 112 sandwiched between two dielectric layers 114, 116. The interconnection 112 may comprise electrically conductive material such as aluminum, copper, titanium, tungsten, combinations thereof, alloys thereof, or other metals or metal alloys. The upper dielectric layer 114 upon which the semiconductor portion 106 is disposed includes a via 150 filled with electrically conductive material to provide electrical connection between the semiconductor portion 106 and the interconnection 112. A passivation layer 118 is also present upon the lower dielectric layer 116. In one embodiment, the passivation layer 118 may comprise polyimide. In one embodiment, the two dielectric layers 114, 116 may comprise silicon oxide, silicon nitride, silicon oxynitride, or combinations thereof.

The bump portion includes the bump 102 itself. The bump 102 includes a solder material portion 120, a bulk portion 122, a plateau portion 124, and an electrically conductive layer 126 between the bulk portion 122 and the solder material portion 120. The plateau portion 124 extends from the bulk portion 122 and contacts the interconnection 112. The plateau portion 124 extends through a via 128 formed through the passivation layer 118 and the lower dielectric layer 116.

Figure 2B:
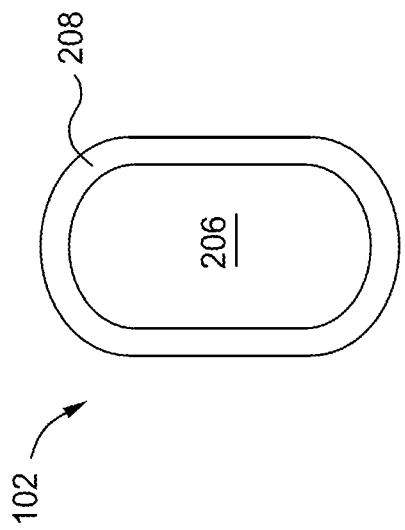
Figure 2C:
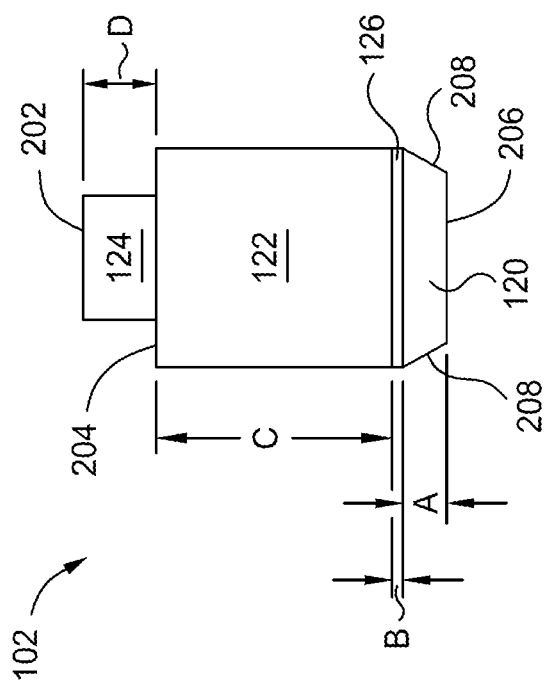
Figure 2D:
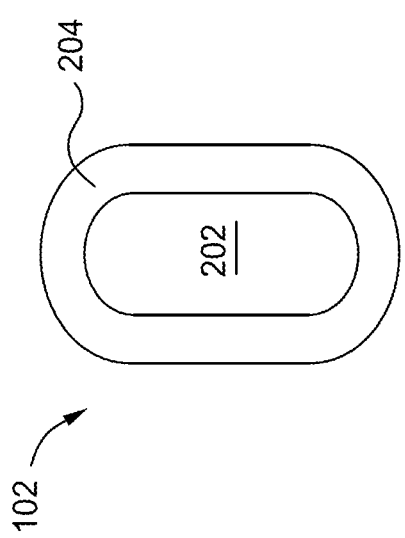

FIGS. 2A-2D are schematic illustrations of a bump 102 according to one embodiment. The bump 102 includes the plateau portion 124, bulk portion 122, solder portion 120, and electrically conductive layer 126. In one embodiment the solder portion comprises SnAg and has a thickness "A" of between about 20 μm and about 25 μm. The electrically conductive layer 126 has a thickness "B" of between about 1 μm and about 5 μm such as about 3 μm and comprises a ferromagnetic material such as Ni. The bulk portion 122 comprises copper and has a thickness "C" of between about 10 μm and about 50 μm. The plateau portion 124 comprises copper and has a thickness "D" or between about 1 μm and about 10 μm. The plateau portion 124 has a top surface 202 extending from the top surface 204 of the bulk portion 122. The solder portion 120 has a bottom surface 206 connected to the electrically conductive layer 126 via sloped sidewalls 208.

FIG. 3 is a graph 300 illustrating stress levels in a flip chip assembly according to one embodiment. As shown in FIG. 3, the locations of the bumps 102 reveal very defined stress locations 302 mostly matching the shape of the plateau portion 124. Of those stress locations 302, several stress locations 302 have extremely high stress at 304 and are thus very susceptible to ELK cracks.

FIG. 4A is a schematic cross-sectional illustration of a flip chip assembly 400 with two bumps 402 according to another embodiment. FIG. 4B is a schematic bottom illustration of the flip chip assembly 400 of FIG. 4A with the two bumps 402 removed. The flip chip assembly 100 includes a flip chip portion 104, the bump portion that includes one or more bumps 402, and the semiconductor portion 106. The semiconductor portion 106 is the same as described above. The flip chip portion 104 is similar to the flip chip portion in FIGS. 1A and 1B, except that the passivation layer 118 is structured differently given the different bump 402 as will be discussed below.

The bump portion includes the bump 402 itself. The bump 402 includes the solder material portion 120, the bulk portion 122, a plurality of pillars 404, and the electrically conductive layer 126 between the bulk portion 122 and the solder material portion 120. The plurality of pillars 404 extend from the bulk portion 122 and contact the interconnection 112. The plurality of pillars 404 extend through vias 128 formed through the passivation layer 118 and the lower dielectric layer 116 such that an area 406 of the passivation layer 118 is present between adjacent pillars and exposed when the bumps 402 are removed as shown in FIG. 4B. The pillars 404 have a width "E" of between about 1 μm and about 30 μm and the pillars 404 are spaced apart by the area 406 having a width "F" of between about 3 μm and about 50 μm.

FIGS. 5A-5D are schematic illustrations of a bump 402 according to one embodiment. The bump 402 includes the plurality of pillars 404, bulk portion 122, solder portion 120, and electrically conductive layer 126. In one embodiment the solder portion comprises SnAg and has a thickness "A" of between about 20 μm and about 25 μm. The electrically conductive layer 126 has a thickness "B" of between about 1 μm and about 5 μm such as about 3 μm and comprises a ferromagnetic material such as Ni. The bulk portion 122 comprises copper and has a thickness "C" of between about 30 μm and about 50 μm. Each pillar 404 comprises copper and has a thickness "G" or between about 1 μm and about 10 μm. Each pillar 404 has a top surface 408 extending from the top surface 204 of the bulk portion 122. The solder portion 120 has a bottom surface 206 connected to the electrically conductive layer 126 via sloped sidewalls 208.

The top surface 204 of the bulk portion 122 has a central rectangular portion 410 when viewed from the top, and two half-circle portions 412 when viewed from the top. The half-circle portions 412 have a length "H" of between about 5 μm and about 50 μm, while the rectangular portion 410 has a height "I" of between about 10 μm and about 80 μm and a width "J" of between about 5 μm and about 50 μm. A ratio of the diameter "E" of the pillars 404 to the width "J" of the rectangular portion 410 of the top surface 204 is between about 0.02 and about 0.2. A ratio of the diameter "E" of the pillars 402 to the length "I" of the rectangular portion 410 is between about 0.01 and about 0.2. A ratio of the diameter "E" of the pillars 402 to the length "H" of the half-circle portions 412 is between about 0.02 and about 0.2. A ratio of the height "G" of the pillars to the height "C" of the bulk portion 122 is between about 0.008 to about 0.1. A ratio of the height "G" of the pillars 404 relative to the height "A" of the solder portion 126 is between about 0.04 to about 0.5. A ratio of the height "G" of the pillars 404 relative to the height "B" of the electrically conductive layer 126 is between about 0.2 to about 10. A ratio of the height "G" of the pillars 404 relative to a height of the bump 402 is between about 0.008 and about 0.06. In total, the pillars 404 collectively cover between about 5 percent and about 30 percent of the top surface 204 of the bulk portion 122. It is to be noted that the pillars 404 are disposed in the rectangular portion 410 of the top surface 204 and not in the half-circle portion 412 in FIG. 5C, but are contemplated to also be disposed in the half-circle portion 412.

FIG. 6 is a graph 600 illustrating stress levels in a flip chip assembly according to one embodiment. As shown in FIG. 6, the locations of the bumps 402 reveal less defined stress locations 602 somewhat matching the shape of the pillars 404. Of those stress locations 602, several stress locations 602 have higher stress at 604, but all of the stress locations 602, when compared to the stress locations 302 of FIG. 3, are less and hence, less susceptible to ELK cracking.

By using several small pillars rather than a single, large plateau, bumps are less likely to cause ELK cracking in flip chip assemblies.

In one embodiment, a bump for a flip chip comprises: a bump body having a first electrically conductive portion, a second electrically conductive portion coupled to the first electrically conductive portion; and a solder portion coupled to the second electrically conductive portion, wherein the first electrically conductive portion comprises at least two pillars extending therefrom in a direction away from the second electrically conductive portion. The first electrically conductive portion is a unitary body. The first electrically conductive portion comprises copper. The second electrically conductive portion comprises a ferromagnetic material. The ferromagnetic material comprises nickel. The at least two pillars comprises six pillars. Each pillar has a height of between about 1 μm and about 10 μm. Each pillar has a diameter of between about 1 μm and about 30 μm. Each pillar is spaced from at least one other pillar by a distance of between about 5 μm and about 50 μm. A height of each pillar is greater than a thickness of the second electrically conductive portion. A flip chip assembly comprising the bump is also contemplated.

In another embodiment, a flip chip assembly comprises: a flip chip body, wherein the flip chip body comprises: an electrically conductive pad; and a first electrically insulating layer disposed on the electrically conductive pad, wherein the first electrically insulating layer has a plurality of openings therethrough exposing the electrically conductive pad; and a bump coupled to the flip chip body, wherein the bump comprises: a bump body having a plurality of electrically conductive pillars, wherein each electrically conductive pillar is disposed in a corresponding opening of the first electrically insulating layer. At least a second electrically insulating layer disposed on the electrically conductive pad between at least a portion of the first electrically insulating layer and the electrically conductive pad. The first electrically insulating layer and the second electrically insulating layer comprise different materials. Each opening has a depth of between about 1 μm and about 10 μm. Each opening has a diameter of between about 1 μm and about 30 μm. Each opening is spaced from at least one other opening by a distance of between about 5 μm and about 50 μm. The electrically conductive pad comprises aluminum, the first electrically insulating layer comprises polyimide, and the electrically conductive pillars comprise copper.

In another embodiment, a flip chip assembly comprises: a flip chip body; and at least one bump coupled to the flip chip body, wherein the bump comprises at least two means to couple the at least one bump to the flip chip body. The flip chip body comprises an insulating layer having openings therethrough wherein a number of openings is equal a number of the means to couple the at least one bump to the flip chip body.

As used herein, the term about generally means plus or minus 5-10% of the value referred to.

While the foregoing is directed to embodiments of the present disclosure, other and further embodiments of the disclosure may be devised without departing from the basic scope thereof, and the scope thereof is determined by the claims that follow.

What is claimed is:

1. A bump for a flip chip, comprising:
   a bump body having a first electrically conductive portion, a second electrically conductive portion coupled to the first electrically conductive portion; and a solder portion coupled to the second electrically conductive portion, wherein the first electrically conductive portion comprises at least two pillars extending therefrom in a direction away from the second electrically conductive portion and the first electrically conductive portion is a unitary body.

2. The bump of claim 1, wherein the first electrically conductive portion comprises copper.

3. The bump of claim 1, wherein the second electrically conductive portion comprises a ferromagnetic material.

4. The bump of claim 3, wherein the ferromagnetic material comprises nickel.

5. The bump of claim 1, wherein the at least two pillars comprises six pillars.

6. The bump of claim 1, wherein each pillar has a height of between about 1 μm and about 10 μm.

7. The bump of claim 1, wherein each pillar has a diameter of between about 1 μm and about 30 μm.

8. The bump of claim 1, wherein each pillar is spaced from at least one other pillar by a distance of between about 5 μm and about 50 μm.

9. The bump of claim 1, wherein a height of each pillar is greater than a thickness of the second electrically conductive portion.

10. A flip chip assembly comprising the bump of claim 1.

11. A flip chip assembly, comprising:
    a flip chip body, wherein the flip chip body comprises:
       an electrically conductive pad; and
       a first electrically insulating layer disposed on the electrically conductive pad, wherein the first electrically insulating layer has a plurality of openings therethrough exposing the electrically conductive pad; and
    a bump coupled to the flip chip body, wherein the bump comprises:
       a bump body having a plurality of electrically conductive pillars, wherein each electrically conductive pillar is disposed in a corresponding opening of the first electrically insulating layer, and wherein the bump body is a unitary body.

12. The flip chip assembly of claim 11, further comprising at least a second electrically insulating layer disposed on the electrically conductive pad between at least a portion of the first electrically insulating layer and the electrically conductive pad.

13. The flip chip assembly of claim 12, wherein the first electrically insulating layer and the second electrically insulating layer comprise different materials.

14. The flip chip assembly of claim 11, wherein each opening has a depth of between about 1 μm and about 10 μm.

15. The flip chip assembly of claim 11, wherein each opening has a diameter of between about 1 μm and about 30 μm.

16. The flip chip assembly of claim 11, wherein each opening is spaced from at least one other opening by a distance of between about 5 μm and about 50 μm.

17. The flip chip assembly of claim 11, wherein the electrically conductive pad comprises aluminum, the first electrically insulating layer comprises polyimide, and the electrically conductive pillars comprise copper.

\* \* \* \* \*